United States Patent
Gallagher et al.

(10) Patent No.: US 8,956,975 B2
(45) Date of Patent: Feb. 17, 2015

(54) ELECTROLESS PLATED MATERIAL FORMED DIRECTLY ON METAL

(71) Applicant: International Business Machines Corporation, Armonk, NY (US)

(72) Inventors: William J. Gallagher, Ardsley, NY (US); Eugene J. O'Sullivan, Nyak, NY (US); Naigang Wang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/781,022

(22) Filed: Feb. 28, 2013

(65) Prior Publication Data

US 2014/0239442 A1 Aug. 28, 2014

(51) Int. Cl.
*H01L 21/288* (2006.01)
*H01L 49/02* (2006.01)
*C23C 18/50* (2006.01)
*C23C 18/16* (2006.01)
*C23C 18/18* (2006.01)

(52) U.S. Cl.
CPC .............. *H01L 21/288* (2013.01); *H01L 28/10* (2013.01); *C23C 18/50* (2013.01); *C23C 18/1605* (2013.01); *C23C 18/1834* (2013.01)
USPC ........................................................ 438/678

(58) Field of Classification Search
CPC ................. H01L 28/10; H01L 21/283; H01L 2224/11462; H01L 21/288; C23C 18/1834; C23C 18/1605; C23C 18/50
USPC ........................................................ 438/678
See application file for complete search history.

(56) References Cited

U.S. PATENT DOCUMENTS

| | | | |
|---|---|---|---|
| 6,030,877 A | 2/2000 | Lee et al. | |
| 7,008,871 B2 | 3/2006 | Andricacos et al. | |
| 7,518,481 B2 * | 4/2009 | Gardner et al. | 336/200 |
| 7,661,186 B2 * | 2/2010 | Wang et al. | 29/601 |
| 7,719,084 B2 | 5/2010 | Gardner et al. | |
| 7,772,106 B2 * | 8/2010 | Lin et al. | 438/614 |
| 7,863,183 B2 * | 1/2011 | Daubenspeck et al. | 438/629 |
| 8,308,858 B2 | 11/2012 | Stewart et al. | |

(Continued)

FOREIGN PATENT DOCUMENTS

| | | |
|---|---|---|
| JP | 2007073611 A | 3/2007 |
| JP | 2009135481 A | 6/2009 |

(Continued)

OTHER PUBLICATIONS

Armyanov, S., et al., "Crystalline and Amorphous Electroless CO-W-P Coatings" Journal of the Electrochemical Society, 152 (9). Jul. 2005. pp. C612-C619.

(Continued)

*Primary Examiner* — William D Coleman
(74) *Attorney, Agent, or Firm* — Tutunjian & Bitetto, P.C.; Vazken Alexanian

(57) ABSTRACT

A method for forming magnetic conductors includes forming a metal structure on a substrate. Plating surfaces are prepared on the metal structure for electroless plating by at least one of: masking surfaces of the metal structure to prevent electroless plating on masked surfaces and/or activating a surface of the metal structure. Magnetic material is electrolessly plated directly on the plating surfaces to form a metal and magnetic material structure.

13 Claims, 7 Drawing Sheets

(56) References Cited

U.S. PATENT DOCUMENTS

| | | | |
|---|---|---|---|
| 8,466,537 B1 * | 6/2013 | Papou et al. | 257/531 |
| 8,846,529 B2 * | 9/2014 | Gallagher et al. | 438/678 |
| 2005/0116317 A1 | 6/2005 | Lee et al. | |
| 2008/0003699 A1 | 1/2008 | Gardner et al. | |
| 2011/0042782 A1 | 2/2011 | Chao et al. | |
| 2012/0269987 A1 | 10/2012 | Dordi et al. | |
| 2012/0279866 A1 | 11/2012 | Fredenberg et al. | |
| 2012/0282768 A1 | 11/2012 | Yu et al. | |

FOREIGN PATENT DOCUMENTS

| | | |
|---|---|---|
| JP | 2012216722 A | 11/2012 |
| KR | 1020050115143 A | 12/2005 |

OTHER PUBLICATIONS

Bae, S., et al., "High Q Ni—Zn—Cu Ferrite Inductor for On-Chip Power Module" IEEE Transactions on Magnetics, vol. 45, No. 10. Oct. 2009. pp. 4773-4776.

Fujimori, H., et al., "Magnetostriction of Cobase Amorphous Alloys and High Frequency Permeability in Their Sputtered Thin Films (Invited)" Journal of Applied Physics 55(6). Mar. 1984. pp. 1769-1774.

Gardner, D., et al., "Integrated On-Chip Inductors Using Magnetic Material (Invited)" Journal of Applied Physics 103. Apr. 2008. (6 pages).

Gromov, A., et al., "Analysis of Current Distribution in Magnetic Film Inductors" Journal of Applied Physics, vol. 85, No. 8. Apr. 1999. pp. 5202-5204.

Gromov, A., et al., "Gigahertz Sandwich Strip Inductors Based on Fe—N Films: The Effect of Flux Closure at the Flange" IEEE Transactions on Magnetics, vol. 46, No. 6. Jun. 2010. pp. 2097-2100.

Hayashi, K., et al., "Magnetic and Other Properties and Sputtering Behavior of Cobase Amorphous Alloy Films" Journal of Applied Physics, 61(8). Apr. 1987. pp. 2983-2992.

Lee, D., et al., "Fabrication and Analysis of High-Performance Integrated Solenoid Inductor With Magnetic Core" IEEE Transactions on Magnetics, vol. 44, No. 11. Nov. 2008. pp. 4089-4095.

Morrow, P., et al., "Design and Fabrication of On-Chip Coupled Inductors Integrated With Magnetic Materials for Voltage Regulators" IEEE Transactions on Magnetics, vol. 47, No. 6. Oct. 2009. pp. 1678-1686.

Nakano, H., et al., "Electroless Deposited Cobalt—Tungsten—Boron Capping Barrier Metal on Damascene Copper Interconnection" Journal of the Electrochemical Society, vol. 152, Issue 3. Feb. 2005. pp. C163-C166.

Petrov, N., et al., "Electrochemical Study of the Electroless Deposition of CO(P) and CO(W, P) Alloys" Journal of the Electrochemical Society, vol. 149(4). Feb. 2002. pp. C187-C194.

Wang, N., et al., "Integrated On-Chip Inductors With Electroplated Magnetic Yokes" Journal of Applied Physics, vol. 111. Apr. 2012. pp. 1-6.

Wu, W., et al., "Investigation of Electroless CO(W, P) Thin Film as the Diffusion Barrier of Underbump Metallurgy" Journal of the Electrochemical Society, 155(5). Mar. 2008. pp. D369-D376.

Office Action mailed on Dec. 12, 2013 for U.S. Appl. No. 13/738,139.

* cited by examiner

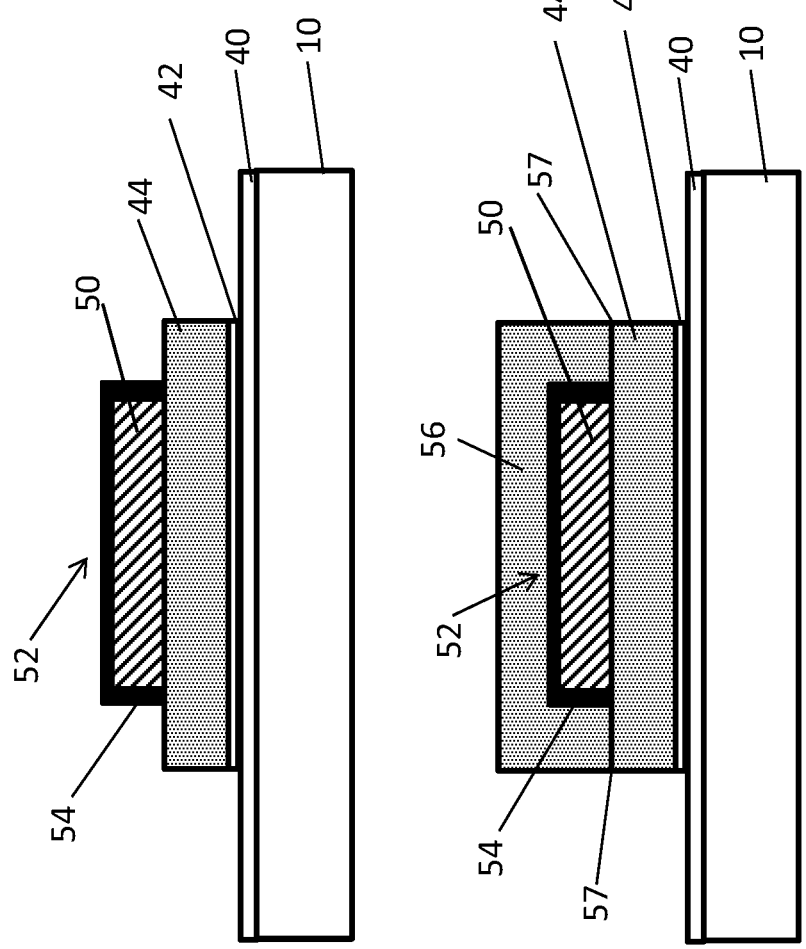

ELECTROLESS PLATED MATERIAL FORMED DIRECTLY ON METAL

RELATED APPLICATION DATA

This application is related to commonly assigned application, entitled: "ELECTROLESS PLATING OF COBALT ALLOYS FOR ON CHIP INDUCTORS," Ser. No. 13/738,139, filed on Jan. 10, 2013 and incorporated herein by reference.

BACKGROUND

1. Technical Field

The present invention relates to electroless plating, and more particularly to electroless plating directly on metals to form inductive or magnetic devices.

2. Description of the Related Art

On-chip magnetic inductors or transformers are passive elements that find wide applications in many fields such as on-chip power converters and radio-frequency integrated circuits. On-chip magnetic inductors/transformers are composed of a set of conductors (e.g., copper lines) to carry current and a magnet yoke or core to store magnetic energy.

Thick on-chip conductors, often made of copper due to its low resistivity, are often electroplated through standard techniques in the semiconductor industry, such as Damascene or plating-through-masks. Fabrication of magnetic yokes, on the other hand, has been challenging. To achieve high energy density, magnetic core materials with a thickness ranging between several 100 nm to a few microns are often desired. Ferrite materials that are often used in bulk inductors have to be processed at high temperature (>800 degrees C.) which is incompatible with semiconductor processing. Thus, a majority of magnetic materials integrated on-chip are magnetic metals such as Ni—Fe, Co—Fe, Co—Zr—Ti and so on. These magnetic metals can be deposited through vacuum deposition technologies (i.e., sputtering) or electrodepositing through aqueous solution.

Sputtering has the ability to deposit a large variety of magnetic materials and to easily produce laminated structures to control magnetic domain structure and reduce eddy currents. However, sputtering usually has low deposition rates, poor conformal coverage, and the derived magnetic films are difficult to pattern. In addition, sputtering requires a large capital expenditure to provide a high vacuum (HV) process in manufacturing, and cleaning up excess sputtered materials in the vacuum chamber can be very difficult.

Electroplating, as mentioned above, has been a standard technique for the deposition of thick metal films due to its high deposition rate, conformal coverage and low cost. One of the challenges of electroplating is to control the current density distribution, both across the wafer and around patterned features. The external source currents required by the electroplating are often carried out by a metallic layer from an edge to the center of the wafer. For large-scale wafers (>200 mm), to achieve a uniform current density distribution can be very difficult. The non-uniformity of the current density distribution will not only cause thickness variation, but also change the composition of the magnetic alloys. Since the magnetic properties of most magnetic alloys are strongly dependent on the composition, the device performance could vary across the whole wafer, which dramatically increases uncertainty.

Because the thicknesses of both conductor and magnetic layers are in the micron range, planarization, at least partially, is required to build up the top layers by using both electroplating and sputtering. Traditional dielectrics used in semiconductor devices, such as silicon oxide or nitride, require long deposition times and also long etching/patterning times. Therefore, planarization is often done by using photo-patternable thick polymers, e.g., polyimide, and hard-baked photoresist. These dielectric layers still require a long-time for baking at high temperature and may introduce high stress and result in delamination problems.

SUMMARY

A method for forming magnetic conductors includes forming a metal structure on a substrate. Plating surfaces are prepared on the metal structure for electroless plating by at least one of: masking surfaces of the metal structure to prevent electroless plating on masked surfaces and/or activating a surface of the metal structure. Magnetic material is electrolessly plated directly on the plating surfaces to form a metal and magnetic material structure.

A method for forming magnetic conductors includes forming mold cavity on a substrate from a dielectric material; depositing a metal conductor in the mold cavity to form a metal structure; removing the dielectric material to expose surfaces of the metal structure; activating plating surfaces on the metal structure for electroless plating; and electrolessly plating magnetic material directly on the plating surfaces to form a metal and magnetic material structure.

An on-chip magnetic device includes a metal shape including one or more plating surfaces, the plating surfaces being configured to permit electroless material growth directly thereon. A magnetic structure includes an electrolessly plated magnetic material formed directly on the metal shape on the plating surfaces to form a metal and magnetic material inductive structure.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 13 is a cross-sectional view of the substrate of FIG. 12 showing an activated layer formed on the metal in accordance with the present principles;

FIG. 14 is a cross-sectional view of the substrate of FIG. 13 showing an electroless magnetic material formed directly on the metal to enclose (or partially enclose) the metal in accordance with the present principles;

DETAILED DESCRIPTION OF PREFERRED EMBODIMENTS

Figure 1:
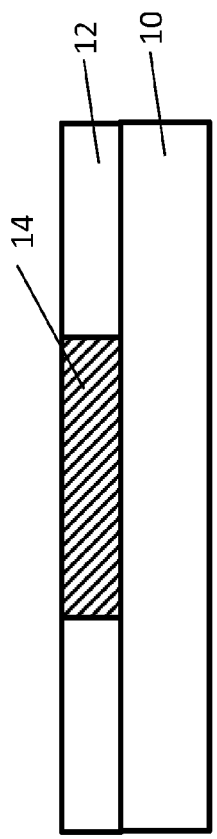
FIG. 1 is a cross-sectional view of a substrate having a dielectric layer (e.g., a resist) and a metal formed therein (e.g., by a damascene method) in accordance with the present principles.

In accordance with the present principles, devices and methods to fabricate on-chip inductors are provided for directly depositing magnetic cores on conductive metal lines (e.g., copper) using electroless deposition. In one embodiment, magnetic materials are deposited directly on copper lines using electroless deposition to form inductive structures. Advantages of direct formation of magnetic materials on highly conductive metals include fewer processing steps (i.e., significantly fewer steps), a global seed layer is not required and no thick dielectric layers are needed. In addition, these magnetic materials and the processing methods can be easily integrated into many on-chip inductor or transformer structures, e.g., a closed-yoke or shielded-slab structure, etc.

Electroless plating is similar to electroplating except that no outside current is needed. Electrons derived from heterogeneous oxidation of a reducing agent at a catalytically active surface reduce metal ions to form metal deposits on a surface. Reducing agents may include hypophosphite, borohydride and amine borane (e.g., dimethylamine borane (DMAB)). Phosphorous (P) and boron (B) are usually co-deposited with metals to form alloys. Possible material systems may include Ni, Fe and Co based materials. For example, materials such as Ni, Fe, CoP, CoB, CoWP, CoWB, CoWPB, CoMoP, CoMoB, mixtures and alloys or these and other materials may be employed. Ni and Fe can be incorporated into the system to tune the magnetic properties. Fe can also replace Co to form Fe-based systems with similar foreign elements.

Electroless processing employs an inexpensive deposition setup with relatively inexpensive chemicals. Patterning may be done on thin seed layers. Magnetic materials are selectively deposited on patterned seeds so that no plating molds are needed. High selectivity deposition results in small global stress, even on large scale wafers. Excellent conformal coverage is also achieved, and no current density distribution problems, often seen in electroplating processes, are present. The electroless deposition processes are efficient at uniformly depositing materials across large scale wafers (e.g., >200 mm), and can even plate multiple wafers simultaneously.

It is to be understood that the present invention will be described in terms of a given illustrative architecture for forming inductors on a wafer or substrate; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present principles may be implemented as integrated circuits. A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

An electroless plating process for forming an on-chip magnetic component is illustratively described herein. The magnetic components may include inductors, transformers, magnetic yokes, magnets, etc.; however, the present description illustratively focuses on inductors, but should not be construed as limiting. Magnetic properties are particularly sensitive for on-chip inductors. Inductors need a thickness larger than about 100 nm and can be up to about 10 microns, although other dimensions (smaller and larger) are contemplated.

Referring now to the drawings in which like numerals represent the same or similar elements and initially to FIG. 1, magnetic yokes or cores are formed directly on metal conductor lines or structures by electroless deposition. In one embodiment, a wafer or substrate 10 may include a semiconductor material, such as Si, SiGe, SiC, Ge, GaAs, or other suitable materials. In other embodiments, additional layers or materials may be employed on or for the substrate 10. A dielectric layer 12 is formed on or over the substrate 10, and patterned using standard processes, e.g., damascene processing, to open up trenches or lines in the dielectric layer 12. The dielectric layer 12 may include an oxide (a silicon oxide), a nitride (e.g., a silicon nitride), or other suitable dielectric material or resist.

A metal layer 14 is deposited. The metal layer 14 may include copper, silver, gold, tungsten, aluminum, or any other suitable metal or alloys thereof In one particularly useful embodiment, the metal layer 14 includes copper. The metal layer 14 may be formed by electroless plating, electroplating, chemical vapor deposition, sputtering, etc. as in a damascene process. A planarizing step may be performed to planarize a top surface of the device.

Figure 2:
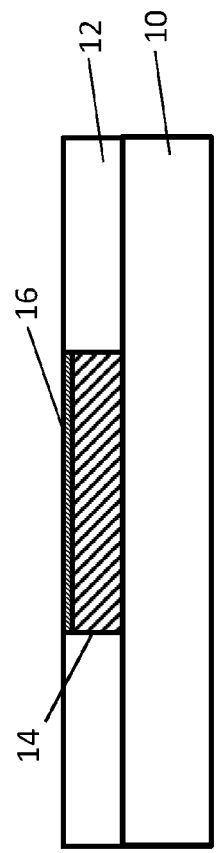
FIG. 2 is a cross-sectional view of the substrate of FIG. 1 showing an activated layer formed on the metal in accordance with the present principles.

Referring to FIG. 2, an activation step is performed depending on the metal in the metal layer 14. For example, catalytic metals such as Ni, Co, Pd, etc. do not need an activation step. Other metals (e.g., Cu) need to employ an activation step. In one embodiment, activation includes immersing the wafer or substrate 10 in a Pd-based solution for about 30 seconds to activate an exposed surface of the metal layer 14. An activated layer 16 is formed.

Figure 3:
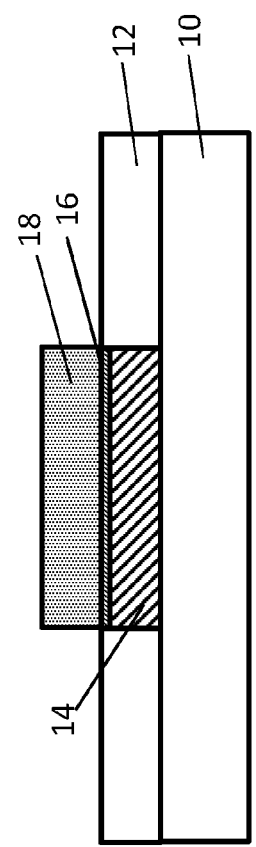
FIG. 3 is a cross-sectional view of the substrate of FIG. 2 showing an electroless magnetic material formed directly on the metal in accordance with the present principles.

Referring to FIG. 3, an electroless plated layer 18 is formed on the activation layer 16. The wafer/substrate 10 is immersed in a bath and a reaction is carried out to electrolessly form layer 18. Layer 18 may include a cobalt based film, such as CoWP, CoWB, CoP, CoB, CoWPB, CoMoP, CoMoB, etc., although other materials may be employed. Layer 18 is selectively electroless-plated directly on the metal layer 14 to form yokes or other structures. In one embodiment, Fe may replace Co. Ni and/or Fe may be employed in the layer 18 to adjust magnetic properties. Layer 18 includes an amorphous phase (or nanocrystalline phase) of the Co (or Fe) based material.

No isolation is needed during the processing or otherwise between the metal layer 14 (conductor) and plated layer 18 (magnetic yoke). The magnetic material (18) is selectively deposited directly on the surface of the conductor 14. Inductance enhancement is achieved by the addition of the magnetic materials.

Figure 4:
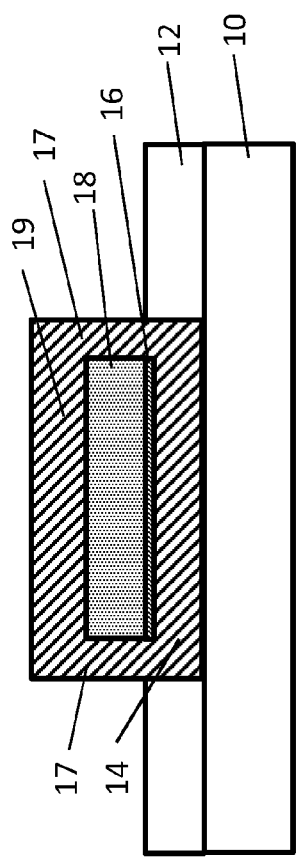
FIG. 4 is a cross-sectional view of the substrate of FIG. 3 showing an optional metal layer and vias formed on the electroless magnetic material to enclose (or partially enclose) the electroless magnetic material in accordance with the present principles.

Referring to FIG. 4, additional metal structures may be desired and may be built on top of those depicted in FIG. 3. For example, another metal layer 19 may be built on top and connected to the metal layer 14 with vias 17. This structure may be employed to form a solenoid inductor. The vias 17 may pass through or around the layer of magnetic materials (layer 18). The resistance in the vias 17 will not significantly change if the size selected for the vias 17 is large enough.

Figure 5:
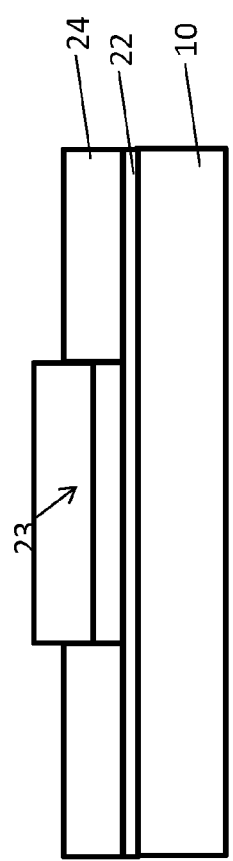
FIG. 5 is a cross-sectional view of a substrate having a dielectric layer (e.g., an adhesion layer) and a trench/mold formed therein in accordance with the present principles.

Referring to FIG. 5, another embodiment includes the substrate 10 having a thin dielectric layer 22 formed over its surface. The dielectric layer 22 may include an oxide (a silicon oxide), a nitride (e.g., a silicon nitride), or other suitable material. A photoresist or other mask layer 24 (e.g., dielectric layer, such as an oxide, nitride, etc.) may be patterned on the dielectric layer 22. The mask layer 24 will be employed to provide a mold (cavity) 23 into which metal will be deposited and formed as will be described.

Figure 6:
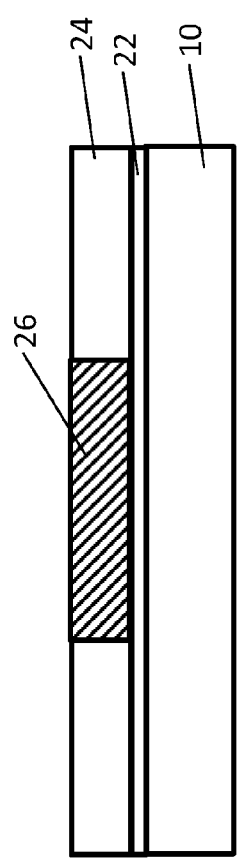
FIG. 6 is a cross-sectional view of the substrate of FIG. 5 showing a metal formed in the trench/mold (e.g., by a damascene method) in accordance with the present principles.

Referring to FIG. 6, a metal layer 26 is deposited. The metal layer 26 may include copper, silver, gold, tungsten, aluminum, or any other suitable metal or alloys thereof. In one particularly useful embodiment, the metal layer 26 includes copper. The metal layer 26 may be formed by electroless plating, electroplating, chemical vapor deposition, sputtering, etc. as in a damascene process. A planarizing step may be performed to planarize a top surface of the device. Next, the mask layer 24 is removed by etching away the material of mask layer 24 to expose a metal structure 27 (FIG. 7).

Figure 7:
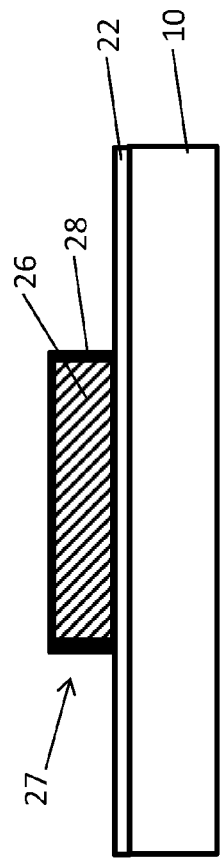
FIG. 7 is a cross-sectional view of the substrate of FIG. 6 showing an activated layer formed on the metal in accordance with the present principles.

Referring to FIG. 7, an activation step is performed depending on the metal in the metal layer 26. For example, catalytic metals such as Ni, Co, Pd, etc. do not need an activation step. Other metals (e.g., Cu) may employ an activation step. In one embodiment, activation includes immersing the wafer or substrate 10 in a Pd-based solution for about 30 seconds to activate an exposed surface of the metal structure 27. An activated layer 28 is formed over the exposed surfaces of the metal structure 27. In this case, the top and sides of the metal structure 27 are exposed. It should be noted that by selectively covering surfaces or portions of surfaces with dielectric material electroless growth will be prevented on the covered surfaces. This can be extended to limiting areas of the metal that are activated. This provides tools for shaping magnetic materials on metal structures (27) in accordance with the present principles.

Figure 8:
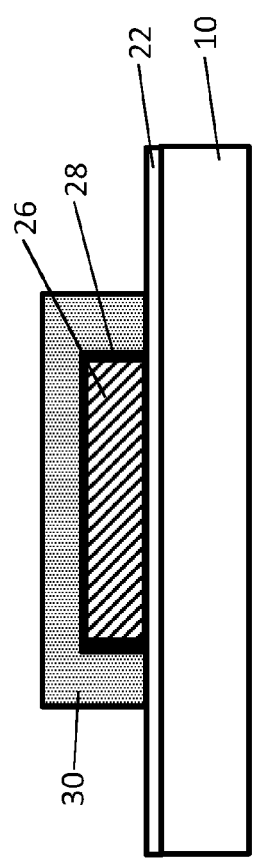
FIG. 8 is a cross-sectional view of the substrate of FIG. 7 showing an electroless magnetic material formed directly on the metal to enclose (or partially enclose) the metal in accordance with the present principles.

Referring to FIG. 8, an electroless plated layer 30 is formed on the activation layer 28. The wafer/substrate 10 is immersed in a bath and a reaction is carried out to electrolessly form layer 30. Layer 30 may include a cobalt based film, such as CoWP, CoWB, CoP, CoB, CoWPB, CoMoP, CoMoB, etc., although other materials may be employed. Layer 30 is selectively electroless-plated directly on the metal layer 26 to form yokes or other structures. In one embodiment, Fe may replace Co. Ni and/or Fe may be employed in the layer 30 to adjust magnetic properties. Layer 30 includes an amorphous phase (or nanocrystalline phase) of the Co (or Fe) based material. As before, no isolation is needed during the processing or otherwise between the metal layer 26 (conductor) and plated layer 30 (magnetic yoke). The magnetic material 30 is selectively deposited directly on the surface of the conductor 26. Inductance enhancement is achieved by the addition of the magnetic materials. One skilled in the art will realize based on the present principles, that other structures may be similarly formed. For example, in one embodiment, additional metal structures may be desired and may be built on top of or to the sides of those depicted.

Figure 9:
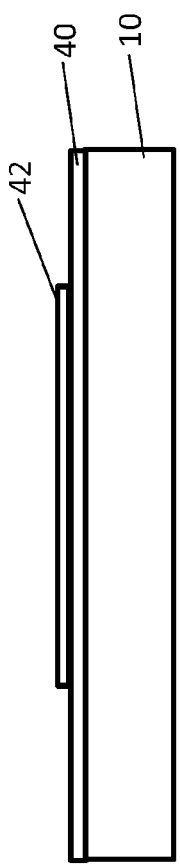
FIG. 9 is a cross-sectional view of a substrate having a dielectric layer (e.g., an adhesion layer) and a patterned seed layer formed thereon in accordance with the present principles.

Referring to FIG. 9, another embodiment employs substrate 10. An adhesion layer 40 may be deposited on the substrate 10 to permit the formation of a seed layer 42 thereon. This adhesion layer 40 is optionally employed and is used to improve the adhesion between a seed layer 42 and the substrate 10. The seed layer 42 is deposited on the adhesion layer 40. The adhesion layer 40 may include Ti, Ta, and/or TaN, although other materials may be employed.

The seed layer 42 may be formed using a physical-vapor-deposition (PVD) process (e.g., sputtering). The seed layer 42 preferably includes a metal, and in particular, the seed layer 14 includes materials that display magnetic properties. The seed layer 42 may include catalytic metals such as Ni, Co, Pd, etc. where no activation is required. Otherwise, other metals (e.g., Cu), can be employed along with an activation step. In a particularly useful embodiment, the seed layer 42 includes a $Ni_{80}Fe_{20}$ film, 30-50 nm thick. A bias magnetic field can be applied during seed layer 42 deposition to produce magnetic anisotropy. Other processes such as annealing in the presence of a magnetic field may be performed after the seed layer 42 is formed to produce magnetic anisotropy.

After deposition, the seed layer 42 is patterned by employing known patterning processes, e.g., lithographic patterning, etc. A top layer or protective layer (not shown), which is optional, may be employed to protect the seed layer 42. The top layer may include Ti although any metal or even non-metal may be employed. The passive top layer is removed just before plating to ensure a pristine seed layer surface.

Figure 10:
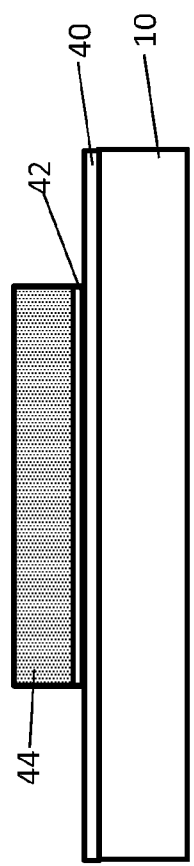
FIG. 10 is a cross-sectional view of the substrate of FIG. 9 showing a magnetic material (bottom yoke) formed on the seed layer (e.g., electrolessly) in accordance with the present principles.

Referring to FIG. 10, a magnetic material layer 44 is formed on the seed layer 42. In one embodiment, the wafer/substrate 10 is immersed in a bath, and a reaction is carried out to electrolessly form layer 44. In other embodiments, the layer 44 may be formed by a process other than electroless plating, for example, electroplating, sputtering, etc. Layer 44 may include a cobalt based film, such as CoWP, CoWB, CoP, CoB, CoWPB, CoMoP, CoMoB, etc., although other materials may be employed. Layer 44 may be selectively electroless-plated directly on the seed layer 42 to form yokes or other structures. In one embodiment, Fe may replace Co. Ni and/or Fe may be employed in the layer 44 to adjust magnetic properties. Layer 44 includes an amorphous phase (or nanocrystalline phase) of the Co (or Fe) based material.

Figure 11:
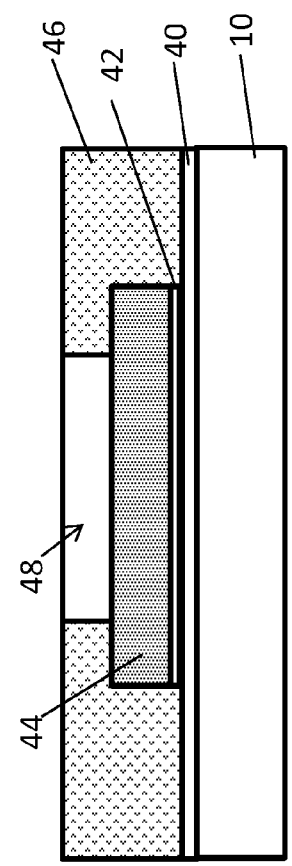
FIG. 11 is a cross-sectional view of the substrate of FIG. 10 showing a resist or dielectric layer formed into a mold over the magnetic material of the bottom yoke in accordance with the present principles.

Referring to FIG. 11, a dielectric layer or resist layer 46, such as a photoresist, is applied over a surface of the plated layer 44 and the adhesion layer 40. The resist 46 is patterned to achieve the desired shape of a mold cavity 48, which will be employed for forming a metal conductor therein.

Figure 12:
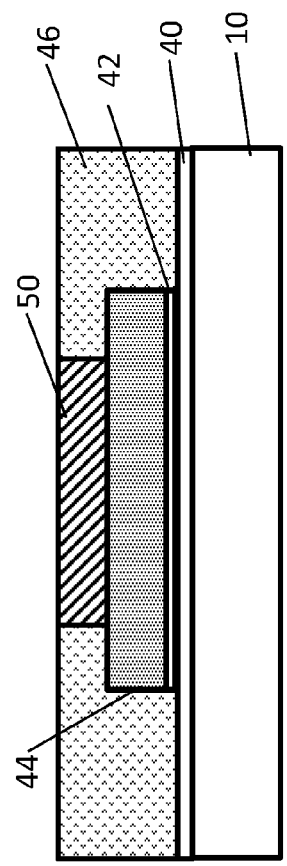
FIG. 12 is a cross-sectional view of the substrate of FIG. 11 showing a metal formed in the mold in accordance with the present principles.

Referring to FIG. 12, a metal layer 50 is deposited. The metal layer 26 may include copper, silver, gold, tungsten, aluminum, or any other suitable metal or alloys thereof. In one particularly useful embodiment, the metal layer 50 includes copper. The metal layer 50 may be formed by electroless plating, electroplating, chemical vapor deposition, sputtering, etc., e.g., as in a damascene process. A planarizing step may be performed to planarize a top surface of the device.

Referring to FIG. 13, the layer 46 is removed by etching to expose a metal structure 52. An activation step is performed depending on the metal in the metal layer 50. For example, catalytic metals such as Ni, Co, Pd, etc. do not need an activation step. Other metals (e.g., Cu) may employ an activation step. In one embodiment, activation includes immersing the wafer or substrate 10 in a Pd-based solution for about 30 seconds to activate an exposed surface of the metal structure 52. An activated layer 54 is formed over the exposed surfaces of the metal structure 52. In this case, the top and sides of the metal structure 52 are exposed. It should be noted that by selectively covering surfaces with dielectric material or selectively activating surfaces or portions of surfaces, control over the shape of electroless growth can be provided. With covering dielectric materials, electroless growth will be prevented on the covered surfaces. With selective activation on metals, electroless growth will occur on the activated portions. These techniques provide ways for shaping magnetic materials on metal structures (52) in accordance with the present principles.

Referring to FIG. 14, an electroless plated layer 56 is formed on the activation layer 54. The wafer/substrate 10 is immersed in a bath and a reaction is carried out to electrolessly form layer 56. Layer 56 may include a cobalt based film, such as CoWP, CoWB, CoP, CoB, CoWPB, CoMoP, CoMoB, etc., although other materials may be employed. Layer 56 is selectively electroless-plated directly on the metal structure 52 to form yokes or other structures. In one embodiment, Fe may replace Co. Ni and/or Fe may be employed in the layer 56 to adjust magnetic properties. Layer 56 includes an amorphous phase (or nanocrystalline phase) of the Co (or Fe) based material. As before, no isolation is needed during the processing or otherwise between the metal structure 52 (conductor) and plated layer 56 (magnetic yoke). The magnetic material is selectively deposited directly on the surface of the conductor. Inductance enhancement is achieved by the addition of the magnetic materials.

In one embodiment, an air gap or dielectric material may be lodged between the plated layer 56 and the plated layer 44 at interface 57 to form a separation between the layer 56 and the layer 44. In other embodiments, plated layer 56 and the plated layer 44 are joined at the interface 57. The layer 44 may form a bottom yoke and the layer 56 may form a top yoke. These yokes may be connected or isolated as the application calls for. In addition, the bottom yoke may be formed by a process other than electroless plating, for example, electroplating, sputtering, etc.

Figure 15:
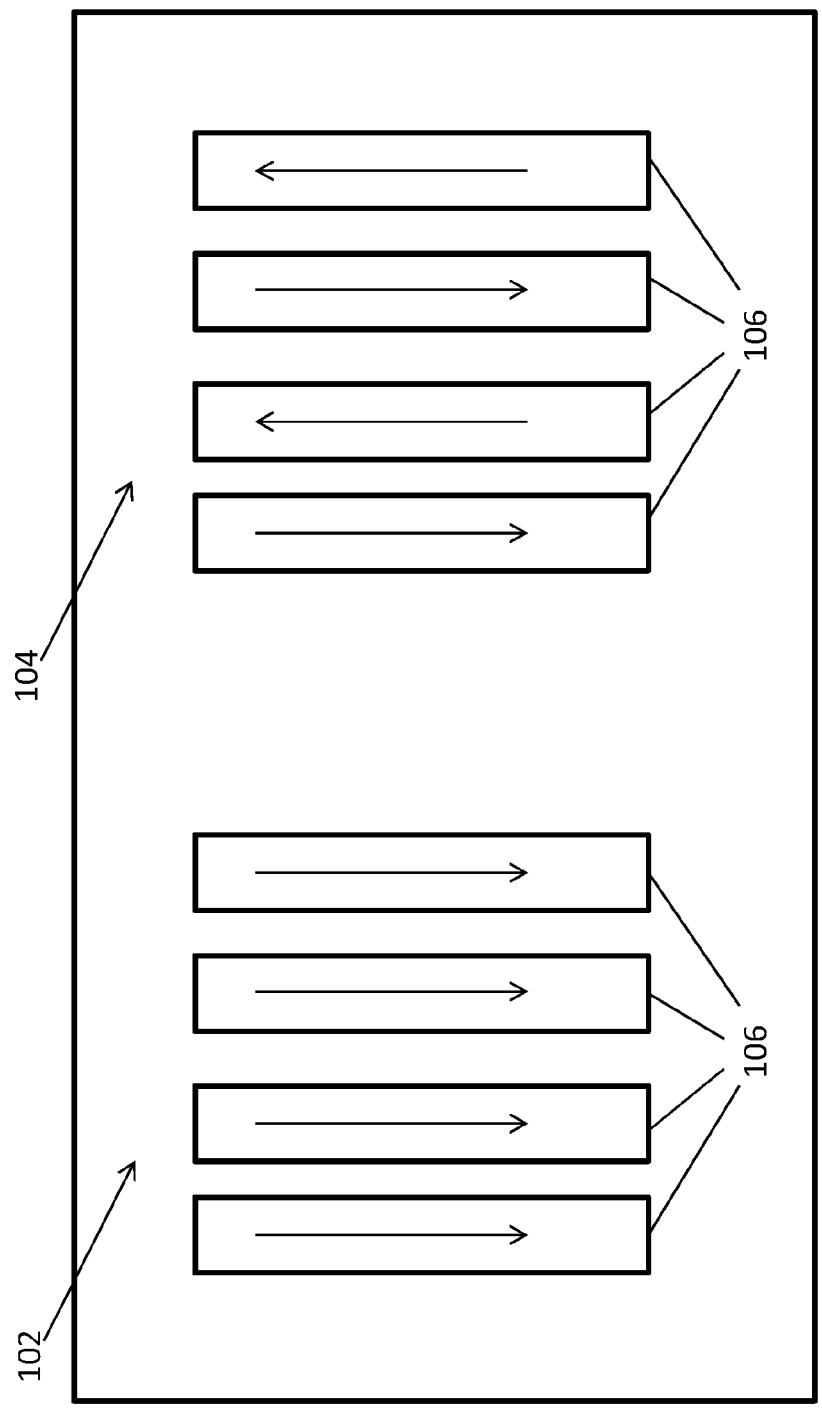
FIG. 15 is a top view showing two multi-turn inductors formed on a surface as lines having metal with magnetic material and being connected below the surface, wherein one of the inductors includes parallel current flow and the other includes zig-zag current flow in accordance with the present principles.

Referring to FIG. 15, coils or inductors 102, 104 may be formed with lines 106 by forming the metal/magnetic material combination structures as described above. The inductors 102, 104 may include subsurface connections (not shown) between lines 106 configured to permit parallel current flow in inductor 102 (indicated by arrows) and an alternating direction (zig-zag) current flow pattern in inductor 104 (indicated by arrows). While depicted as lines 106, it should be understood that the inductors 102, 104 may be comprised of shapes having any planar geometry and are not limited to parallel lines. It should be further understood that the inductors 102 and 104 are depicted as multiple turn inductors and that single turn inductors are also contemplated. The inductor lines 106 may include magnetic/metal structures as described with reference to FIGS. 1-14.

Figure 16:
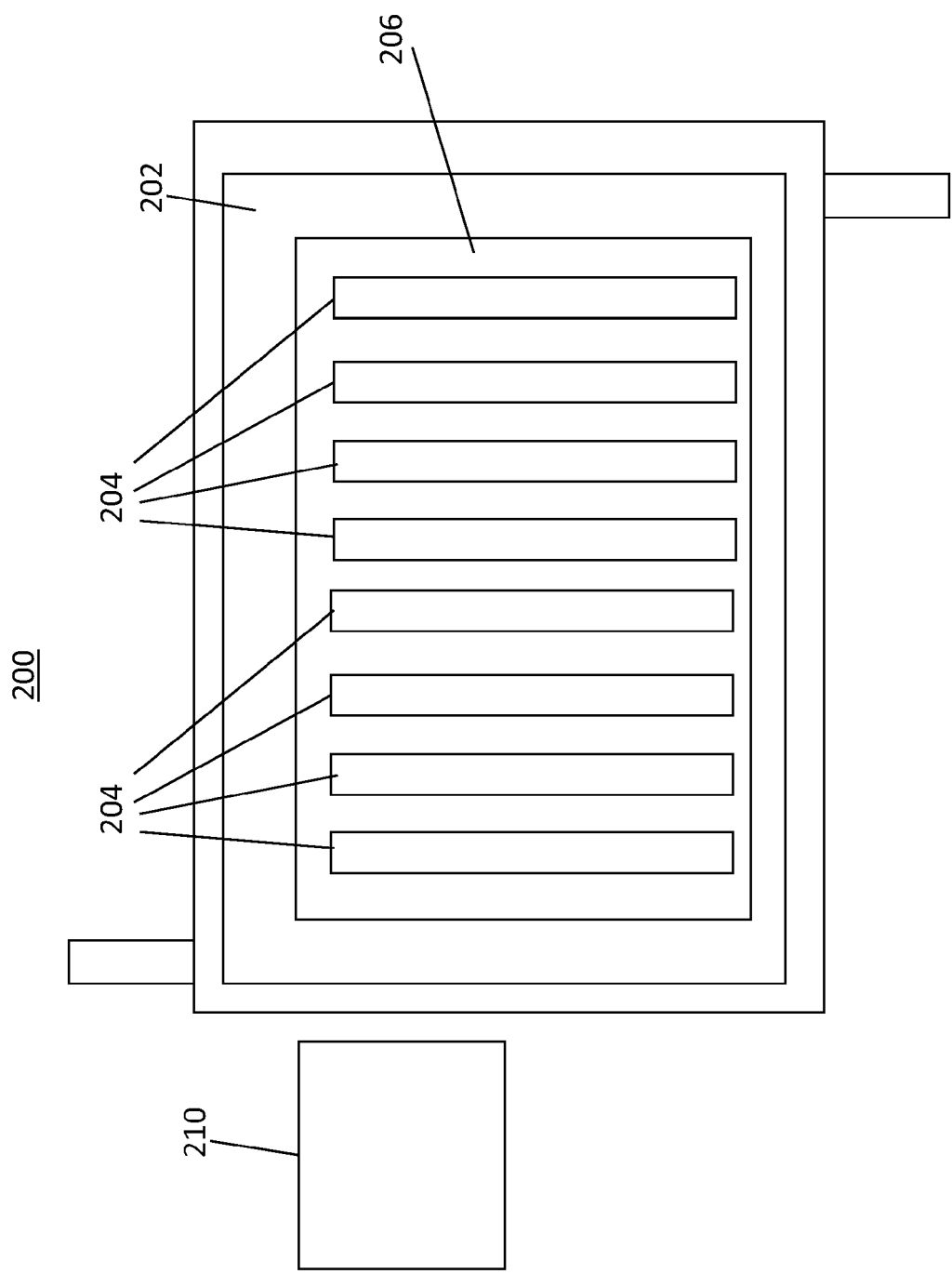
FIG. 16 is a schematic diagram showing an illustrative electroless bath in accordance with the present principles.

Referring to FIG. 16, an illustrative electroless bath 200 is shown in accordance with one exemplary embodiment. The bath 200 includes an electroless solution 202 that may include different chemistries for forming Co or Fe based plating on integrated circuit chips. In one embodiment, multiple wafers 204 are batch processed to reduce time and costs. It should be understood that the wafers 204 may be arranged horizontally, vertically or at any angle in the bath 200 using a holder or stand 206. It should also be understood that individual devices or substrates may be processed in the bath as well.

Electroless plating is similar to electroplating except that no outside current is needed. Electrons derived from heterogeneous oxidation of a reducing agent at a catalytically active surface reduce metal ions to form metal deposits on the surface. The commonly used reducing agents may include, e.g., hypophosphite and DMAB. P and B may be codeposited with metals to form composites.

In particularly useful embodiments, the non-limiting illustrative chemistries employed for plating CoWP may include the following.

TABLE 1

| Component or property | Description | CoWP |
|---|---|---|
| $CoSO_4 \cdot 7H_2O$ (mol/l) | Source of Co | 0.2-1.0 |
| $NaH_2PO_2 \cdot H_2O$ (mol/l) | Reducer/source of P | 0.1-0.4 |
| $Na_2WO_4 \cdot H_2O$ (mol/l) | Source of W | 0.2-0.4 |
| Citric Acid (mol/l) | Complex agent | 0.4-0.8 |
| Boric acid (mol/l) | Buffer | 0.5 |
| Surfactant (ppm) | Surfactant | 10 |
| Inhibitor (ppm) | Inhibitor | 0.1-1.0 |
| pH | — | 8.0-9.0 |
| Temp (C.) | — | 80-90 |

It should be understood that the chemistries shown in Table 1 may include one or more types of stabilizers; one or more types of surfactants; one or more types of buffer (e.g., other than boric acid); one or more complex agents (e.g., other than citric acid); etc. In addition, W can be replaced or partially replaced by other refractory metal or metals, e.g., Mo, Re, etc. Other sources or reducers may also be employed.

A controller or computer device 210 may be employed to control conditions in the bath. For example, the controller 210 may control mixing (agitators or mixers (not shown)), control temperature (using a thermocouple(s) and heaters (not shown)), control pH (by monitoring pH and introducing chemistries (e.g., buffers) as needed), etc. The controller 210 may also include alarms and timing controls to ensure high quality electroless plating parameters.

Electroless plating provides an inexpensive deposition setup, and only relatively low cost chemicals are needed. Deposition is provided selectively on activated metal surfaces. Deposition occurs just in local regions, resulting in small global stress on large scale wafers. Electroless-plating also provides excellent conformal coverage (better than electroplating due to lack of current-density distribution problem). Multiple wafers 204 can be plated simultaneously.

When normalized moment is plotted against applied field in Oe for an electroless plated CoWP film, the film shows good magnetic anisotropy and low coercivity ($H_c$) of less than 1 and often less than 0.1 Oe along both an easy axis and a hard axis of the hysteresis. The resistivity of the films is about 90-130 $\mu\Omega \cdot cm$, which is close to that of most amorphous Co-based alloys. The electroless plating can be performed inside a DC magnetic field, and/or the electroless-plated magnetic yokes can be post annealed in a DC magnetic field, to define magnetic anisotropy.

Most compositions used for conventional diffusion barriers having a Co composition include Co content of greater than 90 atomic percent (at %) Co. These barriers do not provide magnetic properties and act only to prevent diffusion. In accordance with the present principles, the Co atomic percent is less than 90% to achieve better magnetic properties. In accordance with particularly useful embodiments, Co at 10-15 at % is particularly useful, although other percentages are also contemplated. Atomic percent of Co, Ni, Fe, etc. can be carefully and inexpensively controlled for electrolessly deposited magnetic layers. In addition, microstructure, particularly in thick films, can be controlled which can also contribute to magnetic performance (e.g., columnar grains that will degrade magnetic performance are avoided in the electroless process).

Figure 17:
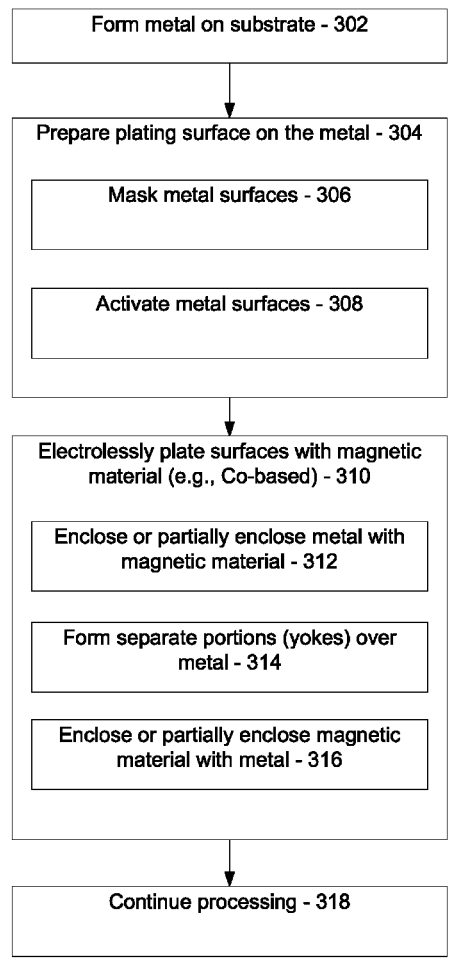
FIG. 17 is a block/flow diagram showing methods for forming an on-chip magnetic structure directly on metal using electroless plating in accordance with illustrative embodiments.

Referring to FIG. 17, a method for forming magnetic conductors is illustratively shown in accordance with exemplary embodiments. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 302, a metal structure is formed on a substrate. The metal structure may include a metal line or other structures. The substrate may include metal structures, layers, magnetic structures or yokes already formed in previous steps. The metal structure may be formed in a dielectric layer as in a damascene process. In block 304, plating surfaces are prepared on the metal structure for electroless plating. This may include at least one of the following steps. In block 306, surfaces of the metal structure are masked to prevent electroless plating on masked surfaces. This may include forming the metal structure in a trench or depositing dielectric material on the metal structure. In block 308, a surface or portion of the surface of the metal structure is activated (where electroless growth is desired). This may include immersing the metal structure in a Pd-based solution.

In block 310, magnetic material is electrolessly plated directly on the plating surfaces (selectively) to form a metal/magnetic material structure. The metal/magnetic material structure preferably forms an inductive or magnetic element. In one particularly useful embodiment, the metal structure includes copper and the magnetic material includes a cobalt based alloy. In one embodiment, the electrolessly plated magnetic material may enclose or at least partially enclose the metal structure in magnetic material in block 312. In another embodiment, the metal structure is formed on a magnetic yoke and the magnetic material formed over the metal structure is separated from the yoke by an air gap or dielectric material in block 314. In yet another embodiment, additional metal (e.g., layers and vias) is formed to enclose or at least partially enclose the magnetic material in block 316.

Having described preferred embodiments for electroless plated material formed directly on metal (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming magnetic conductors, comprising:
   forming a metal structure on a substrate;
   preparing plating surfaces on the metal structure for electroless plating by at least one of: masking surfaces of the metal structure to prevent electroless plating on masked surfaces and activating a surface of the metal structure; and
   electrolessly plating magnetic material directly on the plating surfaces to form a metal and magnetic material structure, wherein electrolessly plating magnetic material includes enclosing or at least partially enclosing the metal structure in magnetic material where the metal structure is formed on a magnetic yoke and the magnetic material formed over the metal structure is separated from the yoke by one of an air gap or dielectric material.

2. The method as recited in claim 1, wherein the metal and magnetic material structure forms an inductive element.

3. The method as recited in claim 1, wherein the metal structure includes copper and the magnetic material includes a cobalt based alloy.

4. The method as recited in claim 1, wherein masking surfaces of the metal structure include forming the metal structure in a trench or depositing dielectric material on the metal structure.

5. The method as recited in claim 1, wherein activating the surface of the metal structure includes immersing the metal structure in a Pd-based solution.

6. The method as recited in claim 1, further comprising forming an additional metal structure over the magnetic material to enclose or at least partially enclose the magnetic material in metal.

7. A method for forming magnetic conductors, comprising:
   forming mold cavity on a substrate from a dielectric material;
   depositing a metal conductor in the mold cavity to form a metal structure;
   removing the dielectric material to expose surfaces of the metal structure;
   activating plating surfaces on the metal structure for electroless plating; and
   electrolessly plating magnetic material directly on the plating surfaces to form a metal and magnetic material structure.

8. The method as recited in claim 7, wherein the metal and magnetic material structure forms an inductive element.

9. The method as recited in claim 7, wherein activating plating surfaces includes immersing the metal structure in a Pd-based solution.

10. The method as recited in claim 7, wherein electrolessly plating magnetic material includes enclosing or at least partially enclosing the metal structure in magnetic material.

11. The method as recited in claim 7, wherein the metal structure includes copper and the magnetic material include a cobalt based alloy.

12. The method as recited in claim 7, further comprising forming an additional metal structure over the magnetic material to enclose or at least partially enclose the magnetic material in metal.

13. The method as recited in claim 11, wherein the metal structure is formed on a magnetic yoke and the magnetic material formed over the metal structure is separated from the yoke by one of an air gap or dielectric material.

* * * * *